US012550532B2

(12) United States Patent
Ka et al.

(10) Patent No.: US 12,550,532 B2
(45) Date of Patent: Feb. 10, 2026

(54) PIXEL, STAGE CIRCUIT AND ORGANIC LIGHT EMITTING DISPLAY DEVICE HAVING THE PIXEL AND THE STAGE CIRCUIT

(71) Applicant: Samsung Display Co., Ltd., Yongin-si (KR)

(72) Inventors: Ji Hyun Ka, Yongin-si (KR); Han Sung Bae, Yongin-si (KR); Won Kyu Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/738,217

(22) Filed: Jun. 10, 2024

(65) Prior Publication Data

US 2024/0334742 A1  Oct. 3, 2024

Related U.S. Application Data

(63) Continuation of application No. 17/967,397, filed on Oct. 17, 2022, now Pat. No. 12,010,873, which is a
(Continued)

(30) Foreign Application Priority Data

Jul. 1, 2016 (KR) ......................... 10-2016-0083492

(51) Int. Cl.
*H10K 59/121* (2023.01)
*G09G 3/3233* (2016.01)
(Continued)

(52) U.S. Cl.
CPC ....... *H10K 59/1213* (2023.02); *G09G 3/3233* (2013.01); *H10D 86/421* (2025.01);
(Continued)

(58) Field of Classification Search
CPC .... H10D 86/423; H10D 86/60; H10D 86/421; G09G 3/3233; G09G 2300/0819;
(Continued)

(56) References Cited

U.S. PATENT DOCUMENTS 7,652,653 B2    1/2010  Nakao et al.
8,138,997 B2 *  3/2012  Kim ..................... G09G 3/3233
                                                         345/76

(Continued)

FOREIGN PATENT DOCUMENTS

CN    1941064       4/2007
CN    204029330    12/2014
(Continued)

OTHER PUBLICATIONS

US 9,196,668 B2, 11/2015, Kim et al. (withdrawn)
(Continued)

*Primary Examiner* — Vinh T Lam
(74) *Attorney, Agent, or Firm* — Sughrue Mion, PLLC

(57) ABSTRACT

A pixel includes a pixel circuit and an organic light emitting diode. The pixel circuit has first, second, third, and fourth transistors. The first transistor controls an amount of current flowing from a first driving power supply coupled to a first node to a second driving power supply through the organic light emitting diode. The turns on when a scan signal is supplied to a first scan line. The third transistor turns on when a scan signal is supplied to a second scan line. The fourth transistor turns on when a scan signal is supplied to a third scan line. The first transistor is a p-type Low Temperature Poly-Silicon thin film transistor and the third transistor and the fourth transistor are n-type oxide semiconductor thin film transistors.

18 Claims, 10 Drawing Sheets

Related U.S. Application Data continuation of application No. 17/179,860, filed on Feb. 19, 2021, now Pat. No. 11,476,315, which is a continuation of application No. 16/538,023, filed on Aug. 12, 2019, now Pat. No. 10,930,724, which is a continuation of application No. 15/619,662, filed on Jun. 12, 2017, now Pat. No. 10,381,426.

(51) Int. Cl.
  *H10D 86/40* (2025.01)
  *H10D 86/60* (2025.01)
  *H10K 59/123* (2023.01)
  *H10K 59/131* (2023.01)

(52) U.S. Cl.
  CPC .......... *H10D 86/423* (2025.01); *H10D 86/60* (2025.01); *H10K 59/123* (2023.02); *H10K 59/131* (2023.02); *G09G 2300/0814* (2013.01); *G09G 2300/0819* (2013.01); *G09G 2300/0861* (2013.01); *G09G 2310/0248* (2013.01); *G09G 2310/0286* (2013.01); *G09G 2310/061* (2013.01); *G09G 2310/08* (2013.01)

(58) Field of Classification Search
  CPC ..... G09G 2300/0814; G09G 2310/061; G09G 2310/0248; G09G 2310/08; G09G 2310/0286; G09G 2300/0861; H10K 59/1213; H10K 59/123; H10K 59/131
  See application file for complete search history.

(56) References Cited

U.S. PATENT DOCUMENTS

| | | | |
|---|---|---|---|
| 8,363,778 B2 | 1/2013 | Koyama et al. | |
| 8,446,344 B2* | 5/2013 | Choi | G09G 3/3266 345/82 |
| 8,531,358 B2* | 9/2013 | Choi | G09G 3/3233 345/76 |
| 8,786,591 B2* | 7/2014 | Park | G09G 3/3233 345/212 |
| 8,791,889 B2* | 7/2014 | Choi | G09G 3/3233 345/82 |
| 8,836,689 B2* | 9/2014 | Miyake | G09G 5/00 345/82 |
| 8,854,343 B2 | 10/2014 | Kishi | |
| 8,907,870 B2* | 12/2014 | Kang | G09G 3/3233 345/76 |
| 8,913,090 B2 | 12/2014 | Chung et al. | |
| 8,937,615 B2 | 1/2015 | Kim | |
| 9,001,009 B2 | 4/2015 | Choi | |
| 9,082,346 B2 | 7/2015 | Shih | |
| 9,189,991 B2 | 11/2015 | Ka et al. | |
| 9,196,225 B2 | 11/2015 | Kanda et al. | |
| 9,215,777 B2 | 12/2015 | Kim | |
| 9,276,050 B2 | 3/2016 | Kwon et al. | |
| 9,324,264 B2 | 4/2016 | Jeong et al. | |
| 9,330,601 B2 | 5/2016 | Lee et al. | |
| 9,343,011 B2 | 5/2016 | Yang et al. | |
| 9,390,648 B2 | 7/2016 | Lee et al. | |
| 9,461,071 B2 | 10/2016 | Umezaki | |
| 9,489,882 B2 | 11/2016 | Kim et al. | |
| 9,514,672 B2 | 12/2016 | Kim | |
| 9,570,009 B2 | 2/2017 | Woo et al. | |
| 9,634,070 B2 | 4/2017 | Shin | |
| 9,697,775 B2 | 7/2017 | Wu | |
| 9,721,507 B2 | 8/2017 | Han | |
| 9,721,509 B2 | 8/2017 | Kim et al. | |
| 9,728,131 B2 | 8/2017 | Han et al. | |
| 9,728,132 B2 | 8/2017 | Wu et al. | |
| 9,761,173 B2 | 9/2017 | Han | |
| 9,824,629 B2 | 11/2017 | Nie | |
| 9,875,688 B2 | 1/2018 | Han | |
| 9,881,551 B2 | 1/2018 | Miyazawa et al. | |
| 10,008,609 B2 | 6/2018 | Koezuka et al. | |
| 10,032,838 B2 | 7/2018 | Nie | |
| 10,037,732 B2 | 7/2018 | Han | |
| 10,056,033 B2 | 8/2018 | Han | |
| 10,297,199 B2 | 5/2019 | Cai | |
| 10,339,859 B2 | 7/2019 | Nie | |
| 10,381,426 B2 | 8/2019 | Ka et al. | |
| 10,446,079 B2 | 10/2019 | Ka et al. | |
| 10,783,832 B2* | 9/2020 | Shin | G09G 3/3275 |
| 10,930,724 B2 | 2/2021 | Ka et al. | |
| 10,950,172 B2 | 3/2021 | Cho et al. | |
| 2004/0239668 A1 | 12/2004 | Morosawa et al. | |
| 2006/0176251 A1 | 8/2006 | Park et al. | |
| 2006/0271757 A1 | 11/2006 | Kim | |
| 2007/0103406 A1 | 5/2007 | Kim | |
| 2008/0170029 A1 | 7/2008 | Kim | |
| 2009/0309863 A1 | 12/2009 | Seto | |
| 2010/0182223 A1 | 7/2010 | Choi et al. | |
| 2011/0084955 A1 | 4/2011 | Kim | |
| 2012/0235972 A1 | 9/2012 | Liu et al. | |
| 2013/0335395 A1 | 12/2013 | Zhan et al. | |
| 2014/0049454 A1 | 2/2014 | Ka | |
| 2014/0111503 A1 | 4/2014 | Kwon et al. | |
| 2014/0139502 A1 | 5/2014 | Han | |
| 2014/0332764 A1 | 11/2014 | Bang et al. | |
| 2014/0333599 A1 | 11/2014 | Lee et al. | |
| 2014/0333686 A1 | 11/2014 | Kim et al. | |
| 2014/0347347 A1 | 11/2014 | Jeong et al. | |
| 2014/0353608 A1 | 12/2014 | Kim et al. | |
| 2015/0049126 A1 | 2/2015 | Jung | |
| 2015/0097762 A1 | 4/2015 | Kim | |
| 2015/0123557 A1 | 5/2015 | Lee et al. | |
| 2015/0124005 A1 | 5/2015 | Wang | |
| 2015/0243220 A1 | 8/2015 | Kim et al. | |
| 2015/0243718 A1 | 8/2015 | Kwon et al. | |
| 2015/0287752 A1* | 10/2015 | Yeo | H10F 39/026 257/43 |
| 2016/0056213 A1 | 2/2016 | Kwak et al. | |
| 2016/0064411 A1 | 3/2016 | Park et al. | |
| 2016/0117990 A1 | 4/2016 | Qian et al. | |
| 2016/0294329 A1 | 10/2016 | Takahashi | |
| 2016/0307497 A1 | 10/2016 | Nie | |
| 2016/0307500 A1 | 10/2016 | Han | |
| 2016/0307501 A1 | 10/2016 | Han | |
| 2016/0307502 A1 | 10/2016 | Nie | |
| 2016/0307509 A1 | 10/2016 | Nie | |
| 2016/0314740 A1 | 10/2016 | Wu | |
| 2016/0365030 A1 | 12/2016 | Wu | |
| 2016/0372037 A1 | 12/2016 | Lim et al. | |
| 2017/0039941 A1 | 2/2017 | Wu et al. | |
| 2017/0039942 A1 | 2/2017 | Han | |
| 2017/0061876 A1 | 3/2017 | Cho et al. | |
| 2017/0110052 A1 | 4/2017 | Kuo | |
| 2018/0102090 A1 | 4/2018 | Han | |
| 2018/0102095 A1 | 4/2018 | Han | |
| 2018/0102397 A1 | 4/2018 | Nie | |
| 2018/0166516 A1* | 6/2018 | Chai | H10K 59/131 |
| 2018/0218676 A1 | 8/2018 | He et al. | |
| 2018/0218683 A1 | 8/2018 | Huangfu et al. | |
| 2018/0226025 A1 | 8/2018 | Wu et al. | |
| 2021/0390907 A1 | 12/2021 | Ka et al. | |

FOREIGN PATENT DOCUMENTS

| | | |
|---|---|---|
| CN | 104575394 | 4/2015 |
| CN | 104715714 | 6/2015 |
| CN | 105427805 | 3/2016 |
| CN | 105679250 | 6/2016 |
| JP | 2004-348026 | 12/2004 |
| JP | 2013-101373 | 5/2013 |
| JP | 2013-161084 | 8/2013 |
| JP | 2014-32379 | 2/2014 |
| JP | 2014-109707 | 6/2014 |
| JP | 2015-225104 | 12/2015 |
| KR | 10-2007-0049907 | 5/2007 |
| KR | 10-0822205 | 4/2008 |
| KR | 10-1048965 | 7/2011 |
| KR | 10-1101070 | 12/2011 |
| KR | 10-2013-0057294 | 5/2013 |

(56) References Cited

FOREIGN PATENT DOCUMENTS

| KR | 10-2014-0018623 | 2/2014 |
| KR | 10-2014-0024155 | 2/2014 |
| KR | 10-2014-0029795 | 3/2014 |
| KR | 10-1408809 | 7/2014 |
| KR | 10-2015-0019592 | 2/2015 |
| KR | 10-2015-0100462 | 9/2015 |
| KR | 10-2015-0100515 | 9/2015 |
| KR | 10-2015-0146117 | 12/2015 |

OTHER PUBLICATIONS

Mativenga, Mallory, et al., "Oxide Versus LTPS TFTs for Active-Matrix Displays", SID Symposium Digest of Technical Papers, pp. 1-4 (Jun. 30, 2014).
European Office Action for European Patent Application No. 17 178 916.7 dated May 13, 2019.
Partial European Search Report corresponding to European Application or Patent No. 17 178 916.7 dated Oct. 20, 2017.
Chinese Office Action for Chinese Patent Application or Patent No. 201710523568.5 filed on Jul. 1, 2021.
Extended European search report for European Patent Application or Patent No. 21210390.7 dated Feb. 24, 2022.
Notice of Allowance with English translation for Korean Patent Application No. 10-2016-0083492, dated Apr. 26, 2023.

\* cited by examiner

PIXEL, STAGE CIRCUIT AND ORGANIC LIGHT EMITTING DISPLAY DEVICE HAVING THE PIXEL AND THE STAGE CIRCUIT

CROSS-REFERENCE TO RELATED APPLICATION(S)

This is a continuation application of U.S. patent application Ser. No. 17/967,397, filed Oct. 17, 2022 (now pending), the disclosure of which is incorporated herein by reference in its entirety. U.S. patent application Ser. No. 17/967,397 is a continuation application of U.S. patent application Ser. No. 17/179,860, filed Feb. 19, 2021, now U.S. Pat. No. 11,476,315, issued Oct. 18, 2022, the disclosure of which is incorporated herein by reference in its entirety. U.S. patent application Ser. No. 17/179,860 is a continuation application of U.S. patent application Ser. No. 16/538,023, filed Aug. 12, 2019, now U.S. Pat. No. 10,930,724, issued Feb. 23, 2021, the disclosure of which is incorporated herein by reference in its entirety. U.S. patent application Ser. No. 16/538,023 is a continuation application of U.S. patent application Ser. No. 15/619,662, filed Jun. 12, 2017, now U.S. Pat. No. 10,381,426, issued Aug. 13, 2019, the disclosure of which is incorporated herein by reference in its entirety. U.S. application Ser. No. 15/619,662 claims priority benefit, under 35 U.S.C. § 119, of Korean Patent Application No. 10-2016-0083492, filed on Jul. 1, 2016 in the Korean Intellectual Property Office, the disclosures of which are incorporated herein by reference for all purposes.

BACKGROUND

1. Field

One or more embodiments described herein relate to a pixel, a stage circuit, and an organic light emitting display device including a pixel and a stage circuit.

2. Description of the Related Art

A variety of displays have been developed. Examples include liquid crystal displays and organic light emitting displays. An organic light emitting display generates an image based on light emitted from pixels that include organic light emitting diodes. Organic light emitting displays has advantages including high response speed and low power consumption.

An organic light emitting display includes pixels connected to data lines and scan lines. Each pixel uses a driving transistor to control the amount of current flowing from a first driving power supply, through an organic light emitting diode, and to a second driving power supply based on a data signal. The organic light emitting diode emits light with predetermined brightness based on the amount of current from the driving transistor.

Attempts have been made to improve the performance of organic light emitting displays. One approach involves setting the second driving power supply to a low voltage in an attempt to improve brightness. Another approach involves driving the display at low frequency in an attempt to reduce power consumption. However, both approaches may allow predetermined current leakage to occur from a gate electrode of the driving transistor. As a result, a data signal voltage for each pixel may not be maintained during one frame period. Consequently, an image with a desired brightness may not be displayed.

SUMMARY

In accordance with one or more embodiments, a pixel comprising an organic light emitting diode; a first transistor having a first electrode coupled to a first node and a second electrode coupled to an anode electrode of the organic light emitting diode, the first transistor to control an amount of current flowing from a first driving power supply coupled to the first node to a second driving power supply through the organic light emitting diode; a second transistor coupled between a data line and the first node, the second transistor to turn on when a scan signal is supplied to an ith first scan line, where i is a natural number; a third transistor coupled between a gate electrode and the second electrode of the first transistor, the third transistor to turn on when a scan signal is supplied to an ith second scan line; a fourth transistor coupled between the gate electrode of the first transistor and an initialization power supply, the fourth transistor to turn on when a scan signal is supplied to an ith third scan line, wherein the first transistor is a p-type Low Temperature Poly-Silicon (LTPS) thin film transistor and the third transistor and the fourth transistor are n-type oxide semiconductor thin film transistors.

The second transistor may be a p-type LTPS thin film transistor. The second transistor may be an n-type oxide semiconductor thin film transistor. The ith first scan line and the ith second scan line may be a same scan line. The pixel may include a fifth transistor coupled between the initialization power supply and the anode electrode of the organic light emitting diode, the fifth transistor to turn on when the scan signal is supplied to the ith first scan line, the fifth transistor is a p-type LTPS thin film transistor.

The pixel may include a fifth transistor coupled between the initialization power supply and the anode electrode of the organic light emitting diode, the fifth transistor is to turn on when the scan signal is supplied to the ith second scan line, wherein the fifth transistor is an n-type oxide semiconductor thin film transistor.

The pixel may include a sixth transistor coupled between the second electrode of the first transistor and the anode electrode of the organic light emitting diode, the sixth transistor is to turn off when a light emission control signal is supplied to a light emission control line; and a seventh transistor coupled between the first node and the first driving power supply, the seventh transistor is to turn off when the light emission control signal is supplied, wherein the sixth transistor and the seventh transistor are p-type LTPS thin film transistors.

In accordance with one or more other embodiments, a pixel includes an organic light emitting diode; a first transistor to control an amount of current flowing from a first driving power supply coupled to a first electrode, through the organic light emitting diode, and to a second driving power supply based on a voltage of a first node; a second transistor coupled between the first node and a second electrode of the first transistor, the second transistor is to turn on when a scan signal is supplied to an ith first scan line; a storage capacitor coupled between the first node and a second node; a third transistor coupled between a data line and the second node, the third transistor to turn on when a scan signal is supplied to an ith second scan line; and a fourth transistor coupled between the second node and an initialization power supply, the fourth transistor to turn off when an inverted light emission control signal is supplied to an inverted light emission control line, wherein the first transistor is a p-type LTPS thin film transistor and the third transistor and the fourth transistor are n-type oxide semiconductor thin film transistors.

The second transistor may be a p-type LTPS thin film transistor. The second transistor may be an n-type oxide semiconductor thin film transistor. The ith first scan line and the ith second scan line may be a same scan line. The pixel may include a fifth transistor coupled between the initialization power supply and an anode electrode of the organic light emitting diode, the fifth transistor to turn on when the scan signal is supplied to the ith first scan line, the fifth transistor is a p-type LTPS thin film transistor.

The pixel may include a fifth transistor coupled between the initialization power supply and an anode electrode of the organic light emitting diode, the fifth transistor to turn on when the scan signal is supplied to the ith second scan line, wherein the fifth transistor is an n-type oxide semiconductor thin film transistor.

The pixel may include a sixth transistor coupled between the second electrode of the first transistor and the anode electrode of the organic light emitting diode, the sixth transistor to turn off when a light emission control signal is supplied to a light emission control line, wherein the sixth transistor is a p-type LTPS thin film transistor and the light emission control signal and the inverted light emission control signal are inverted relative to each other.

In accordance with one or more other embodiments, a stage circuit includes a first transistor, a second transistor, a third transistor, and a fourth transistor coupled in series between a first power supply and a second power supply set to a voltage lower than the first power supply; a fifth transistor, a sixth transistor, a seventh transistor, and an eighth transistor coupled in series between the first power supply and the second power supply; and a ninth transistor and a tenth transistor coupled in series between the first power supply and the second power supply, wherein: the first transistor is a p-type LTPS thin film transistor and has a gate electrode to receive an output signal from a previous stage or a start pulse the second transistor is a p-type LTPS thin film transistor and has a gate electrode to receive a first clock signal, the third transistor is an n-type oxide semiconductor thin film transistor and has a gate electrode to receive a second clock signal having a same cycle as the first clock signal and an inverted phase, the fourth transistor is an n-type oxide semiconductor thin film transistor and has a gate electrode to receive the output signal from the previous stage and the start pulse, the fifth transistor is a p-type LTPS thin film transistor and has a gate electrode coupled to an output terminal, the sixth transistor is a p-type LTPS thin film transistor and has a gate electrode to receive the second clock signal, the seventh transistor is an n-type oxide semiconductor thin film transistor and has a gate electrode to receive the first clock signal, the eighth transistor is an n-type oxide semiconductor thin film transistor and has a gate electrode coupled to the output terminal, the ninth transistor is a p-type LTPS thin film transistor and has a gate electrode coupled to a first node, the tenth transistor is an n-type oxide semiconductor thin film transistor and has a gate electrode coupled to the first node, and a common node between the second transistor and the third transistor and a common node between the sixth transistor and the seventh transistor electrically connected to the first node.

In accordance with one or more other embodiments, an organic light emitting display device includes pixels connected to scan lines, light emission control lines, and data lines; a scan driver to drive the scan lines and the light emission control lines; and a data driver to drive the data lines, wherein at least one pixel in an ith horizontal line, among the pixels, includes: an organic light emitting diode; a first transistor having a first electrode coupled to a first node and a second electrode coupled to an anode electrode of the organic light emitting diode, wherein the first transistor is to control an amount of current flowing from a first driving power supply coupled to the first node, through the organic light emitting diode, and to a second driving power supply; a second transistor coupled between a data line and the first node, the second transistor to turn on when a scan signal is supplied to an ith first scan line; a third transistor coupled between a gate electrode and the second electrode of the first transistor, the third transistor to turn on when a scan signal is supplied to an ith second scan line; and a fourth transistor coupled between the gate electrode of the first transistor and an initialization power supply, the fourth transistor to turn on when a scan signal is supplied to an ith third scan line, wherein the first transistor is a p-type LTPS thin film transistor and the third transistor and the fourth transistor are n-type oxide semiconductor thin film transistors.

The pixel may include a fifth transistor coupled between the initialization power supply and the anode electrode of the organic light emitting diode, the fifth transistor to turn on when the scan signal is supplied to the ith second scan line, wherein the fifth transistor is an n-type oxide semiconductor thin film transistor. The pixel may include sixth transistor coupled between the second electrode of the first transistor and the anode electrode of the organic light emitting diode, the sixth transistor to turn off when a light emission control signal is supplied to an ith light emission control line; and a seventh transistor coupled between the first node and the first driving power supply, the seventh transistor to turn off when the light emission control signal is supplied, wherein the sixth transistor and the seventh transistor are p-type LTPS thin film transistors.

The scan driver may include a plurality of stage circuits to drive the scan lines and the light emission control lines, and at least one of the stage circuits may include an eleventh transistor, a twelfth transistor, a thirteenth transistor, and a fourteenth transistor coupled in series between a first power supply and a second power supply set to a voltage lower than the first power supply; a fifteenth transistor, a sixteenth transistor, a seventeenth transistor and an eighteenth transistor coupled in series between the first power supply and the second power supply; and a nineteenth transistor and a twentieth transistor coupled in series between the first power supply and the second power supply, wherein the eleventh transistor is a p-type LTPS thin film transistor and has a gate electrode to receive an output signal from a previous stage or a start pulse, the twelfth transistor is set to a p type LTPS thin film transistor and has a gate electrode to receive a first clock signal, the thirteenth transistor is an n-type oxide semiconductor thin film transistor and has a gate electrode to receive a second clock signal having a same cycle as the first clock signal and an inverted phase, the fourteenth transistor is an n-type oxide semiconductor thin film transistor and has a gate electrode to receive the output signal from the previous stage or the start pulse, the fifteenth transistor is set to a p type LTPS thin film transistor and has a gate electrode coupled to an output terminal, the sixteenth transistor is a p-type LTPS thin film transistor and has a gate electrode to receive the second clock signal, the seventeenth transistor is an n-type oxide semiconductor thin film transistor and has a gate electrode to receive the first clock signal, the eighteenth transistor is an n type oxide semiconductor thin film transistor and has a gate electrode coupled to the output terminal; the nineteenth transistor is a p-type LTPS thin film transistor and has a gate electrode coupled to the first node, the twentieth transistor is an n-type oxide semiconductor thin film transistor and has a gate electrode coupled to the first node, and a common node between the twelfth transistor and the thirteenth transistor and a common node between the sixteenth transistor and the seventeenth transistor are electrically connected to the first node.

In accordance with one or more other embodiments, a pixel includes a first transistor to control current to a light emitter; and a second transistor coupled to at least one of the light emitter, the first transistor, or a capacitor, wherein the first transistor is a Low Temperature Poly-Silicon (LTPS) transistor and the second transistor is different from an LTPS transistor, the first and second transistors having different conductivity types. The second transistor may be an oxide semiconductor transistor. The first transistor may be a p-type transistor and the second transistor may be an n-type transistor. The second transistor may place the first transistor in a diode-connected state when turned on. The second transistor may be connected to a data line.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
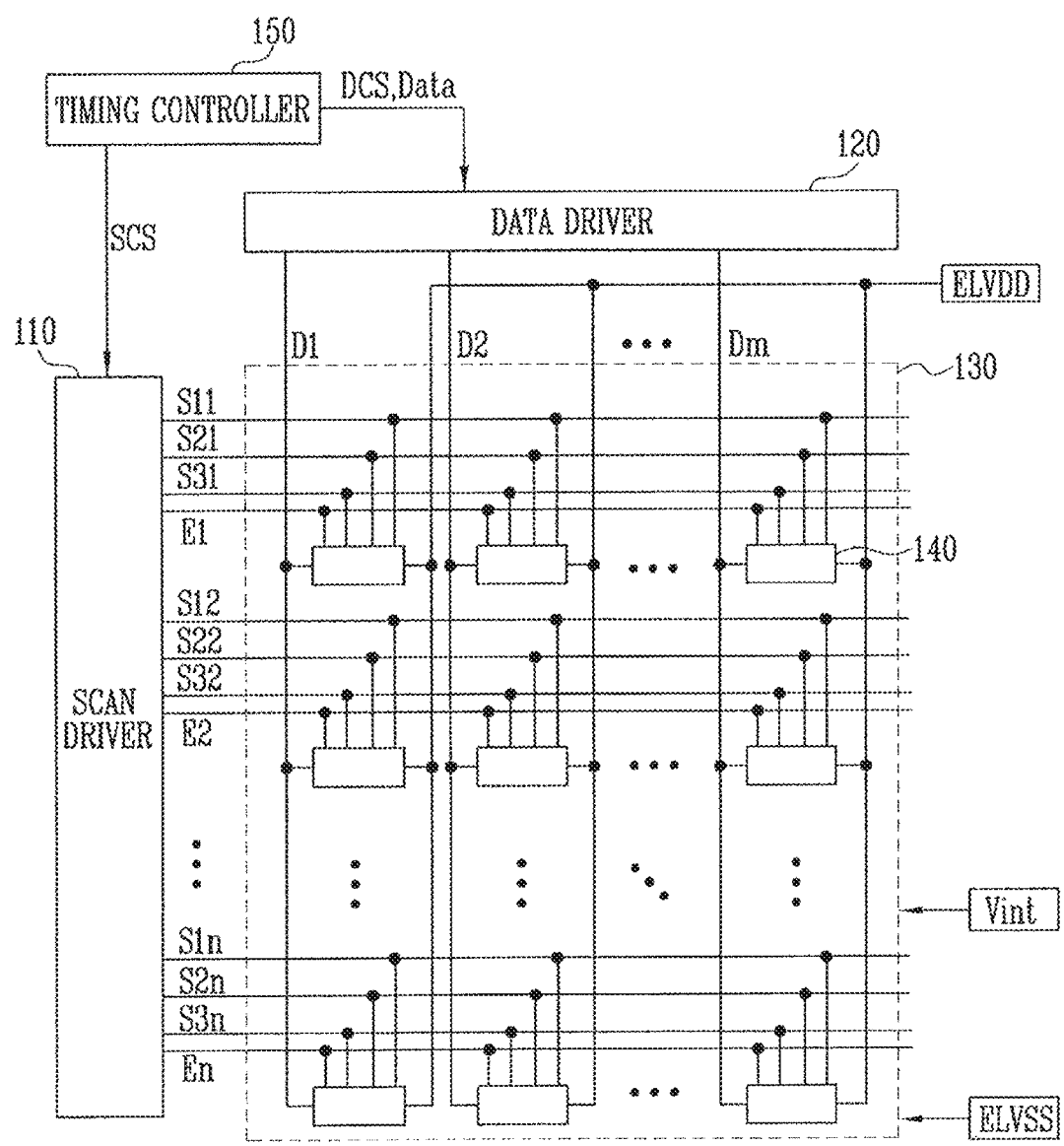
FIG. 1 illustrates an embodiment of an organic light emitting display device.

Example embodiments will now be described with reference to the drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected to" another element, it can be directly connected to the element or it can be electrically connected to the element with one or more intervening elements interposed. In addition, in the drawings, parts that are not related to the present invention are omitted in order to clarify the present invention. Like reference numerals refer to like elements throughout.

FIG. 1 illustrates an embodiment of an organic light emitting display device which includes pixels 140 connected to scan lines S11 to S1n, S21 to S2n and S31 to S3n, light emission control lines E1 to En, and data lines D1 to Dm, a scan driver 110 driving the scan lines S11 to S1n, S21 to S2n and S31 to S3n and the light emission control lines E1 to En, a data driver 120 driving the data lines D1 to Dm, and a timing controller 150 controlling the scan driver 110 and the data driver 120.

The timing controller 150 may generate a data driving control signal DCS and a scan driving control signal SCS based on externally supplied synchronous signals. The data driving control signal DCS and the scan driving control signal SCS generated by the timing controller 150 may be supplied to the data driver 120 and the scan driver 110, respectively. In addition, the timing controller 150 may realign and supply externally supplied data to the data driver 120.

The scan driving control signal SCS may include start pulses and clock signals. The start pulses may be applied to control the first timings of scan signals and light emission control signals. The clock signals may be applied to shift the start pulses.

The data driving control signal DCS may include a source start pulse and clock signals. The source start pulse may be applied to control a sampling start point of data and the clock signals may be applied to control a sampling operation.

The scan driver 110 may receive the scan driving control signal SCS from the timing controller 150. The scan driver 110 receiving the scan driving control signal SCS may supply scan signals to the first scan lines S11 to S1n, the second scan lines S21 to S2n, and the third scan lines S31 to S3n. For example, the scan driver 110 may sequentially supply first scan signals to the first scan lines S11 to S1n, sequentially supply second scan signals to the second scan lines S21 to S2n, and sequentially supply third scan signals to the third scan lines S31 to S3n. When the first, second and third scan signals are sequentially supplied, pixels 140 may be selected in units of horizontal lines.

The scan driver 110 may supply a second scan signal to an ith second scan line S2i to overlap a first scan signal supplied to an ith first scan line S1i, where i is a natural number. The first scan signal and the second scan signal may be set to signals having opposite polarities. For example, the first scan signal may be set to a low voltage and the second scan signal may be set to a high voltage. In addition, the scan driver 110 may supply a third scan signal to an ith third scan line S3i before supplying the second scan signal to the ith second scan line S2i. The third scan signal may be set to a high voltage. In addition, the ith third scan line scan line S3i may be replaced by an (i−1)th second scan line S2i−1.

In addition, each of the first, second, and third scan signals may be set to a gate-on voltage. Transistors in the pixel 140 may be set to a turn-on state based on the first scan signal. Another transistor in the pixel 140 may be set to a turn-on state based on the second signal. Another transistor in the pixel 140 may be set to a turn-on state based on the third scan signal.

The scan driver 110 receiving the scan driving control signal SCS may supply light emission control signals to the light emission control lines E1 to En. For example, the scan driver 110 may sequentially supply the light emission control signals to the light emission control lines E1 to En. Each of the light emission control signals may be applied to control emission time of each of the pixels 140. Thus, in one embodiment, a light emission control signal may be set to have a greater width than a scan signal. For example, the scan driver 110 may supply scan signals to an (i−1)th first scan line S1i−1 and the ith first scan line S1i to overlap with the light emission control signal supplied to an ith light emission control signal Ei.

The scan driver 110 may be mounted on a substrate, for example, through a thin film process. In one embodiment, the scan driver 110 may be located at different sides of the pixel unit 130. In addition, scan driver 110 is illustrated to supply the scan signals and light emission control signals. In another embodiment, different drivers may supply the scan signals and light emission control signals.

The light emission control signals may be set to gate-off voltages (e.g., high voltages) to turn off transistors in the pixels 140. Transistors in the pixel 140 may be turned off based on the light emission control signal and may be turned on for another period or the remaining period.

The data driver 120 may supply data signals to the data lines D1 to Dm based on the data driving control signal DCS. The data signals supplied to the data lines D1 to Dm may be supplied to the pixels 140 selected by the first scan signals (or second scan signals). The data driver 120 may supply the data signals to the data lines D1 to Dm in synchronization with the first scan signals (or second scan signals). The data driver 120 may supply the data signals to the data lines D1 to Dm in synchronization with the first scan signals (or second scan signals).

The pixel unit 130 may include the pixels 140 coupled to the S11 to S1n, S21 to S2n, and S31 to S3n, the light emission control lines E1 to En, and the data lines D1 to Dm. The pixels 140 may receive a first driving power supply ELVDD, a second driving power supply ELVSS, and an initialization power supply Vint from an external device.

Each of the pixels 140 may include a driving transistor and an organic light emitting diode. The driving transistor may control the amount of current flowing from the first driving power supply ELVDD, through the organic light emitting diode, and to the second driving power supply ELVSS based on a data signal. A gate electrode of the driving transistor may be initialized based on a voltage of the initialization power supply Vint before the data signal is supplied.

In FIG. 1, n scan lines S11 to S1n, n scan lines S21 to S2n, n scan lines S31 to S3n, and n light emission control lines E1 to En are illustrated. In another embodiment, based on the circuit configuration of the pixels 140, pixels in the current horizontal line may be additionally connected to a scan line in the previous horizontal line. In this circuit configuration of the pixels 140, dummy scan lines and/or dummy light emission control lines may be additionally formed.

In FIG. 1, the first scan lines S11 to S1n, the second scan lines S21 to S2n, and the third scan lines S31 to S3n. In another embodiment, only one of the first, second, and third scan lines S11 to S1n, S21 to S2n, and S31 to S3n may be included based on the circuit configuration of the pixels 140.

In FIG. 1, light emission control lines E1 to En are illustrated. In another embodiment, inverted light emission control lines may further be included based on the circuit configuration of the pixels 140. The inverted light emission control lines may receive inverted light emission control signals of the light emission control signals.

Figure 2:
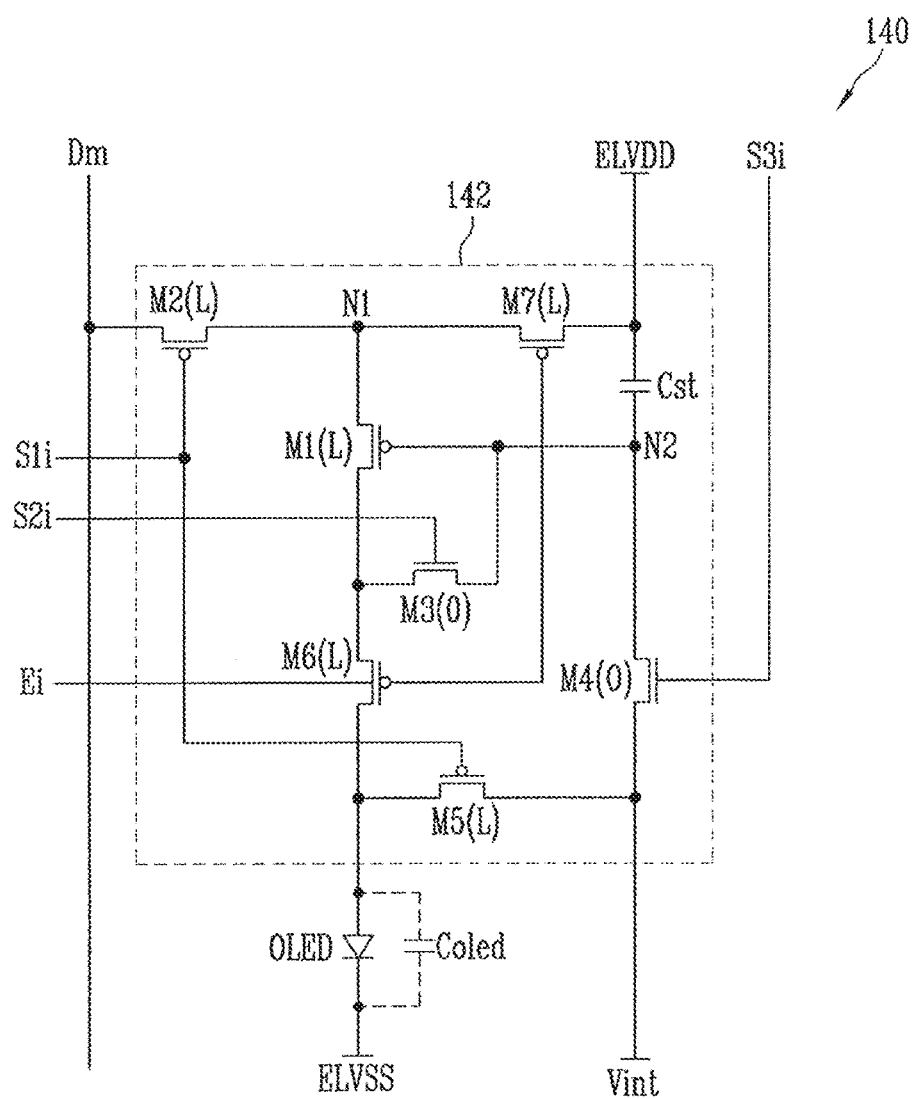
FIG. 2 illustrates an embodiment of a pixel.

FIG. 2 illustrates an embodiment of a pixel, which, for example, may be representative of pixels 140. For convenience of explanation, the pixel is illustrated as being located in an ith horizontal line and connected to an mth data line Dm.

Referring to FIG. 2, the pixel 140 may include an oxide semiconductor thin film transistor and a Low Temperature Poly-Silicon (LTPS) thin film transistor. The oxide semiconductor thin film transistor may include a gate electrode, a source electrode, and a drain electrode. The oxide semiconductor thin film transistor may include an active layer including an oxide semiconductor material. The oxide semiconductor material may be, for example, an amorphous or crystalline oxide semiconductor material. The oxide semiconductor thin film transistor may be, for example, an n-type transistor.

The LTPS thin film transistor may include a gate electrode, a source electrode, and a drain electrode. The LTPS thin film transistor may include an active layer including polysilicon. The LTPS thin film transistor may be, for example, a p-type thin film transistor or an n type thin film transistor. The LTPS thin film transistor may have high electron mobility and high driving characteristics.

The oxide semiconductor thin film transistor may allow for a low temperature process and have lower charge mobility than the LTPS thin film transistor. The oxide semiconductor thin film transistor may have excellent off current characteristics.

The pixel 140 may include a pixel circuit 142 and an organic light emitting diode OLED. The organic light emitting diode OLED may have an anode electrode coupled to the pixel circuit 142 and a cathode electrode coupled to the second driving power supply ELVSS. The organic light emitting diode OLED may emit light with a predetermined brightness based on the amount of current from the pixel circuit 142.

The pixel circuit 142 may control the amount of current flowing from the first driving power supply ELVDD, through the organic light emitting diode OLED, and to the second driving power supply ELVSS based on a data signal. The pixel circuit 142 may include a first transistor M1(L) (driving transistor), a second transistor M2(L), a third transistor M3(O), a fourth transistor M4(O), a fifth transistor M5(L), a sixth transistor M6(L), a seventh transistor M7(L), and a storage capacitor Cst.

The first transistor M1(L) may have a first electrode coupled to a first node N1, a second electrode coupled to a first electrode of the sixth transistor M6(L), and a gate electrode coupled to a second node N2. The first transistor M1(L) may control the amount of current supplied from the first driving power supply ELVDD, through the organic light emitting diode OLED, and to the second driving power supply ELVSS based on a voltage stored in the storage capacitor Cst. To ensure a high driving speed, the first transistor M1(L) may include an LTPS thin film transistor and, for example, may be a p-type transistor.

The second transistor M2(L) may be coupled between the data line Dm and the first node N1. A gate electrode of the second transistor M2(L) may be coupled to the ith first scan line S1i. The second transistor M2(L) may be turned on when the first scan signal is supplied to the ith first scan line S1i to electrically connect the data line Dm to the first node N1. The second transistor M2(L) may include an LTPS thin film transistor and, for example, may be a p-type transistor.

The third transistor M3(O) may be coupled between a second electrode of the first transistor M1(L) and the second node N2. A gate electrode of the third transistor M3(O) may be coupled to the ith second scan line S2i. The third transistor M3(O) may be turned on when a second scan signal is supplied to the ith second scan line S2i, in order to place the first transistor M1(L) in a diode-connected state.

When the third transistor M3(O) includes an oxide semiconductor thin film transistor, the third transistor M3(O) may be, for example, an n-type transistor. When the third transistor M3(O) is an oxide semiconductor thin film transistor, leakage current flowing from the second node N2 to the second electrode of the first transistor M1(L) may be reduced, so that an image with desired brightness may be displayed.

The fourth transistor M4(O) may be connected between the second node N2 and the initialization power supply Vint. A gate electrode of the fourth transistor M4(O) may be coupled to an ith third scan line S3i. The fourth transistor M4(O) may be turned on when a third scan signal is supplied to the ith third scan line S3i, in order to supply a voltage of the initialization power supply Vint to the second node N2.

The fourth transistor M4(O) may be an oxide semiconductor thin film transistor and, for example, may be an n-type transistor. When the fourth transistor M4(O) is an oxide semiconductor thin film transistor, leakage current flowing from the second node N2 to the initialization power supply Vint may be reduced in order to display an image with desired brightness.

The fifth transistor M5(L) may be connected between the anode electrode of the organic light emitting diode OLED and the initialization power supply Vint. The gate electrode of the fifth transistor M5(L) may be coupled to the ith first scan line S1i. The fifth transistor M5(L) may be turned on when the first scan signal is supplied to the ith first scan line S1i, in order to supply the voltage of the initialization power supply Vint to the anode electrode of the organic light emitting diode OLED. The fifth transistor M5(L) may be an LTPS thin film transistor and, for example, may be a p-type transistor.

The voltage of the initialization power supply Vint may be lower than the range of data voltages for the data signals. When the voltage of the initialization power supply Vint is supplied to the anode electrode of the organic light emitting diode OLED, a parasitic capacitor (e.g., organic capacitor Coled) of the organic light emitting diode OLED may be discharged. When the organic capacitor Coled is discharged, black expression capabilities of the pixel 140 may be improved.

In one embodiment, the organic capacitor Coled may store a predetermined voltage based on current from the pixel circuit 142 during the previous frame. When the predetermined voltage is stored in the organic capacitor Coled, the organic light emitting diode OLED may easily emit light at low current.

A black data signal may be supplied to the pixel circuit 142 during the current frame period. When the black data signal is supplied, the pixel circuit 142 may not, ideally, supply current to the organic light emitting diode OLED. However, even when the black data signal is supplied, predetermined leakage current may be supplied from the first transistor M1(L) to the organic light emitting diode OLED. When the organic capacitor Coled stores the predetermined voltage, the organic light emitting diode OLED may finely emit light and, thus, black expression capabilities may be deteriorated.

According to one embodiment, when the organic capacitor Coled is discharged by the initialization power supply Vint, the organic light emitting diode OLED may be set to a non-light emitting state even when leakage current is supplied from the first transistor M1(L). Thus, the leakage current from the first transistor M1(L) may previously charge the organic capacitor Coled, so that the organic capacitor Coled may maintain a non-light emitting state.

The sixth transistor M6(L) may be coupled between the second electrode of the first transistor M1(L) and the anode electrode of the organic light emitting diode OLED. In addition, a gate electrode of the sixth transistor M6(L) may be coupled to a light emission control line Ei. The sixth transistor M6(L) may be turned off when a light emission control signal is supplied to the light emission control line Ei and may be turned on when the light emission control signal is not supplied. The sixth transistor M6(L) may be an LTPS thin film transistor and, for example, may be a p-type transistor.

The seventh transistor M7(L) may be coupled between the first driving power supply ELVDD and the first node N1. A gate electrode of the seventh transistor M7(L) may be connected to the light emission control line Ei. The seventh transistor M7(L) may be turned off when a light emission control signal is supplied to the light emission control line Ei, and may be turned on when the light emission control signal is not supplied. The seventh transistor M7(L) may be an LTPS thin film transistor and, for example, may be a p-type transistor.

The storage capacitor Cst may be coupled between the first driving power supply ELVDD and the second node N2. The storage capacitor Cst may store a voltage corresponding to the data signal and a threshold voltage of the first transistor M1(L).

In the present embodiment, the third transistor M3(0) and the fourth transistor M4(O) coupled to the second node N2 may be oxide semiconductor thin film transistors. When the third transistor M3(0) and the fourth transistor M4(O) are oxide semiconductor thin film transistors, current leakage from the second node N2 may be reduced. As a result, an image with desired brightness may be displayed.

In the present embodiment, transistors M7(L), M1(L), and M6(L) in a current supply path for supplying current to the organic light emitting diode OLED may be LTPS thin film transistors. When transistors M7(L), M1(L), and M6(L) in the current supply path are LTPS thin film transistors, current may be stably supplied to the organic light emitting diode OLED by high driving characteristics.

Figure 3A:
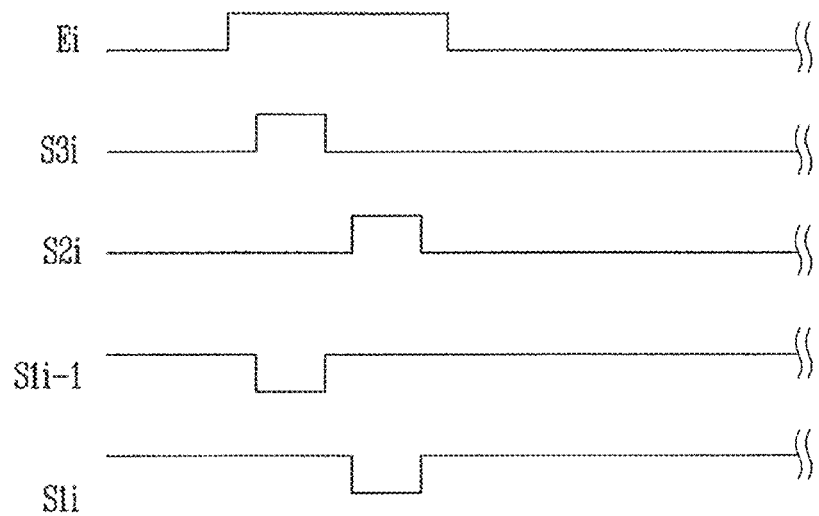
FIGS. 3A-3B illustrate waveforms for embodiments of a method for driving a pixel.

FIG. 3A illustrates a waveform corresponding to an embodiment of a method for driving a pixel, for example, as illustrated in FIG. 2. Referring to FIG. 3A, a light emission control signal (high voltage) may be supplied to the light emission control line Ei to turn off the sixth transistor M6(L) and the seventh transistor M7(L), which are p-type transistors. When the sixth transistor M6(L) is turned off, electrical connection between the first transistor M1(L) and the organic light emitting diode OLED may be blocked. When the seventh transistor M7(L) is turned off, electrical connection between the first driving power supply ELVDD and the first node N1 may be blocked. Therefore, during a period in which the light emission control signal is supplied to the light emission control line Ei, the pixel 140 may be set to a non-light emitting state.

Subsequently, a third scan signal (high voltage) may be supplied to an ith third scan line S3i. When the third scan signal is supplied to the ith third scan line S3i, the fourth transistor M4(O), which is an n-type transistor, may be turned on. When the fourth transistor M4(O) is turned on, the voltage of the initialization power supply Vint may be supplied to the second node N2.

After the voltage of the initialization power supply Vint is supplied to the second node N2, a first scan signal (low voltage) may be supplied to the ith first scan line S1i and a second scan signal (high voltage) may be supplied to the ith second scan line S2i.

When the first scan signal is supplied to the ith first scan line S1i, the second transistor M2(L) and the fifth transistor M5(L), which are p-type transistors, may be turned on. When the fifth transistor M5(L) is turned on, the voltage of the initialization power supply Vint may be supplied to the anode electrode of the organic light emitting diode OLED. When the voltage of the initialization power supply Vint is supplied to the anode electrode of the organic light emitting diode OLED, the organic capacitor Coled may be discharged. When the second transistor M2(L) is turned on, the data line Dm and the first node N1 may be electrically connected to each other to supply the data signal from the data line Dm to the first node N1.

When the second scan signal is supplied to the ith second scan line S2i, the third transistor M3(O), which is an n-type transistor, may be turned on. When the third transistor M3(O) is turned on, the first transistor M1(L) may be placed in a diode-connected state. Since second node N2 is initialized to the voltage of initialization power supply Vint lower than the data signal, the first transistor M1(L) may be turned on.

When the first transistor M1(L) is turned on, the data signal supplied to the first node NI may pass to the second node N2 through the first transistor M1(L) in a diode-connected state. The second node N2 may be set to a voltage corresponding to the data signal and the threshold voltage of the first transistor M1(L). The storage capacitor Cst may store the voltage applied to the second node N2.

After the voltage of the second node N2 is stored in the storage capacitor Cst, supply of the light emission control signal to the light emission control line Ei may be stopped. When the supply of the light emission control signal to the light emission control line Ei is stopped, the sixth transistor M6(L) and the seventh transistor M7(L) may be turned on.

When the sixth transistor M6(L) is turned on, the first transistor M1(L) may be electrically connected to the organic light emitting diode OLED. When the seventh transistor M7(L) is turned on, the first driving power supply ELVDD may be electrically connected to the first node N1. The first transistor M1(L) may control the amount of current flowing from the first driving power supply ELVDD through the organic light emitting diode OLED to the second driving power supply ELVSS based on the voltage of the second node N2.

The second node N2 may be connected to the third transistor M3(O) and the fourth transistor M4(O), which are oxide semiconductor thin film transistors, to reduce leakage current. Therefore, the second node N2 may maintain a desired voltage during one frame period, and the pixel 140 may generate light with desired brightness based on a data signal during one frame period.

Figure 3B:
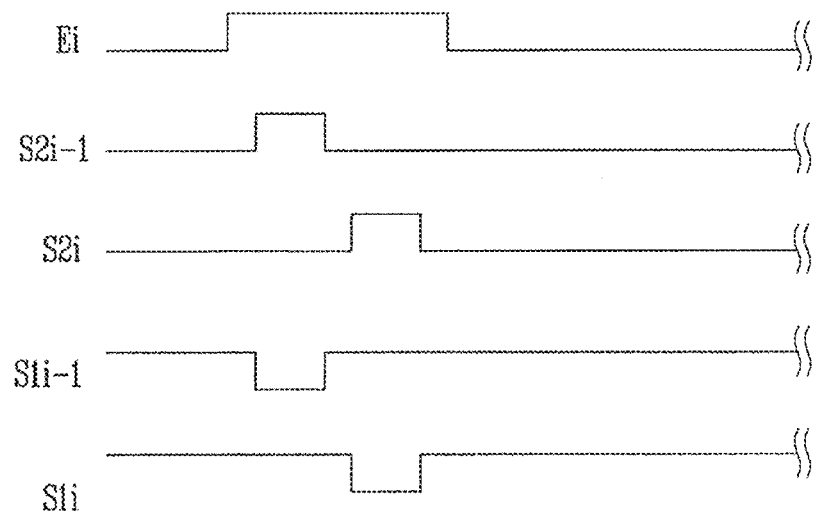

According to an embodiment, the ith third scan line S3i may be replaced by the (i−1)th second scan line S2i−1. In this embodiment, as illustrated in FIG. 3B, a second scan signal supplied to the (i−1)th second scan line S2i−1 may be supplied to the fourth transistor M4(O). Otherwise, the same operations described above may be performed.

Figure 4:
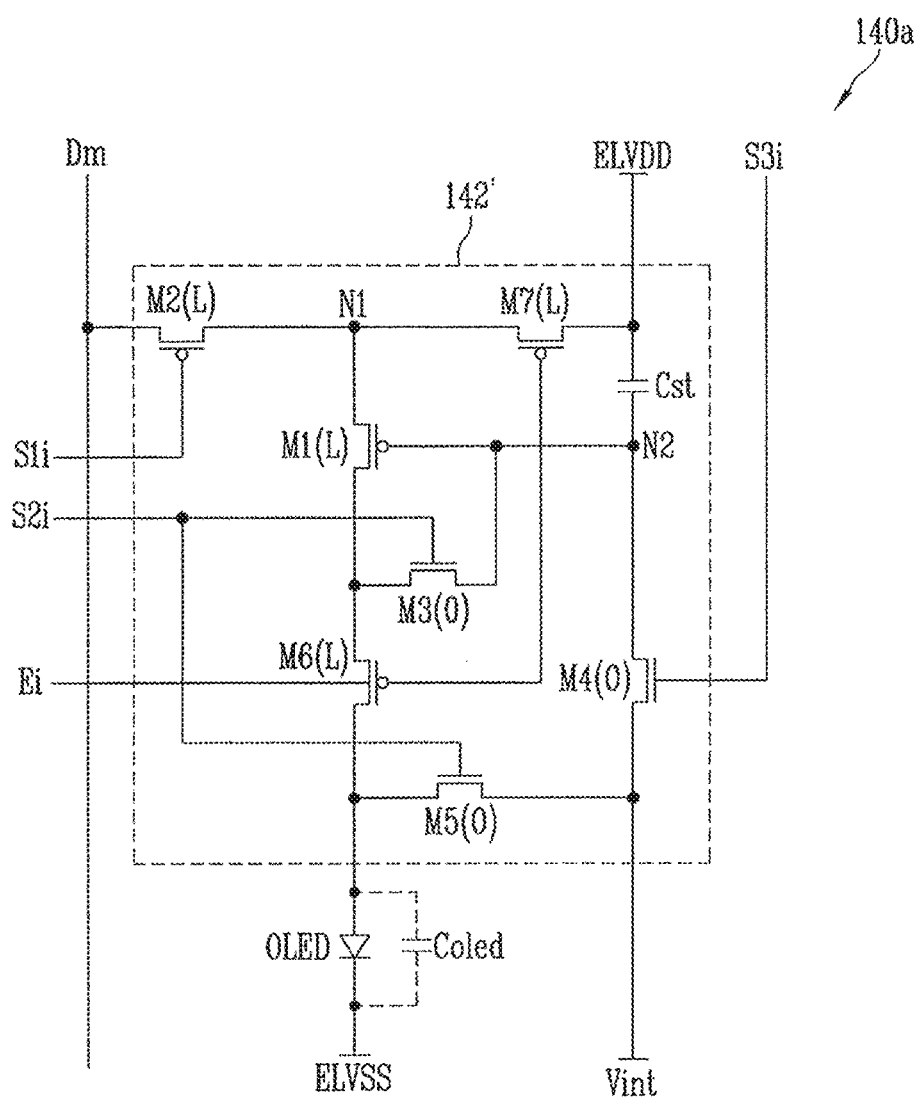
FIG. 4 illustrates another embodiment of a pixel.

FIG. 4 illustrates another embodiment of a pixel 140a, which, for example, may be representative of the pixels in the display device of FIG. 1. Referring to FIG. 4, the pixel 140a may include a pixel circuit 142' and the organic light emitting diode OLED.

The organic light emitting diode OLED has an anode electrode coupled to the pixel circuit 142' and a cathode electrode coupled to the second driving power supply ELVSS. The organic light emitting diode OLED may generate light with predetermined brightness based on the amount of current supplied from the pixel circuit 142'.

The pixel circuit 142' may include the first transistor M1(L), the second transistor M2(L), the third transistor M3(O), the fourth transistor M4(O), the fifth transistor M5(O), the sixth transistor M6(L), the seventh transistor M7(L) and the storage capacitor Cst. The pixel circuit 142' in FIG. 4 may have substantially the same configuration as the pixel circuit 142 in FIG. 2, except that the fifth transistor M5(O) is an oxide semiconductor thin film transistor.

The fifth transistor M5(O) may be coupled between the anode electrode of the organic light emitting diode OLED and the initialization power supply Vint. The gate electrode of the fifth transistor M5(O) may be coupled to the ith second scan line S2i. The fifth transistor M5(O) may be turned on when a second scan signal is supplied to the ith second scan line S2i, in order to supply a voltage of the initialization power supply Vint to the anode electrode of the organic light emitting diode OLED. The fifth transistor M5(O) may be an n-type transistor.

When the fifth transistor M5(O) is an oxide thin film transistor, leakage current supplied to the initialization power supply Vint from the anode electrode of the organic light emitting diode OLED may be reduced during light emission time. When the leakage current supplied from the anode electrode of the organic light emitting diode OLED to the initialization power supply Vint is reduced, the organic light emitting diode OLED may generate light with desired brightness.

In addition, the fifth transistor M5(O) may be turned on when the second scan signal is supplied to the ith second scan line S2i. In one embodiment, the fifth transistor M5(O) may perform substantially the same operations as described in FIG. 2.

Figure 5:
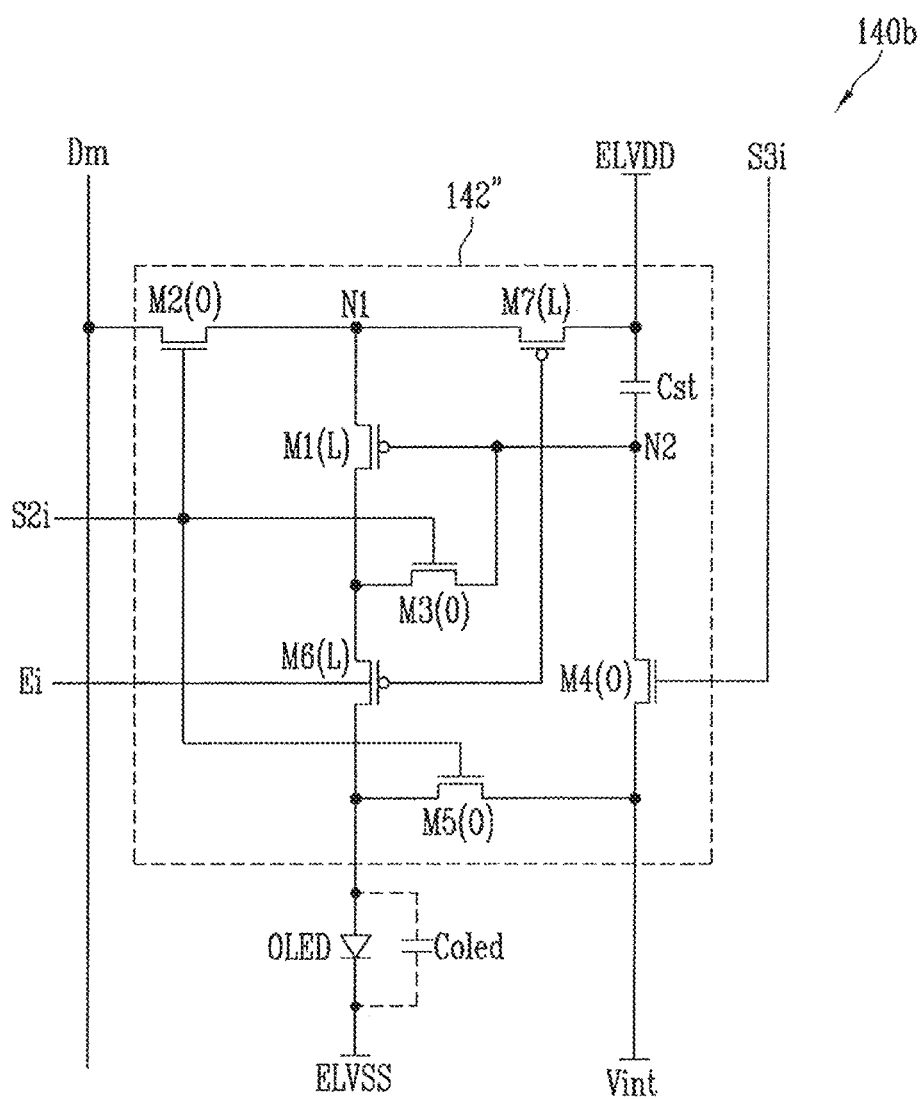
FIG. 5 illustrates another embodiment of a pixel.

FIG. 5 illustrates another embodiment of a pixel 140b which includes a pixel circuit 142" and the organic light emitting diode OLED. Referring to FIG. 5, the pixel 140b may include a pixel circuit 142" and the organic light emitting diode OLED.

The organic light emitting diode OLED has an anode electrode which may be coupled to the pixel circuit 142" and a cathode electrode coupled to the second driving power supply ELVSS. The organic light emitting diode OLED may generate light with desired brightness based on the amount of current supplied from the pixel circuit 142".

The pixel circuit 142" may include the first transistor M1(L), a second transistor M2(O), the third transistor M3(O), the fourth transistor M4(O), the fifth transistor M5(O), the sixth transistor M6(L), the seventh transistor M7(L) and the storage capacitor Cst. The pixel circuit 142" may have substantially the same configuration as the pixel circuit 142' in FIG. 4, except that the second transistor M2(O) is an oxide semiconductor thin film transistor.

The second transistor M2(O) may be coupled between the data line Dm and the first node N1. A gate electrode of the second transistor M2(O) may be coupled to the ith second scan line S2i. The second transistor M2(O) may be turned on when the second scan signal is supplied to the ith second scan line S2i to electrically connect the data line Dm to the first node N1. The second transistor M2(O) may be an n-type transistor.

When the second transistor M2(O) is an oxide thin film transistor, undesirable current flow between the first node N1 and the data line Dm may be reduced and the organic light emitting diode OLED may generate light with desired brightness. In addition, when the second transistor M2(O) is an n-type transistor, a first scan line S1 may be removed.

Figure 6:
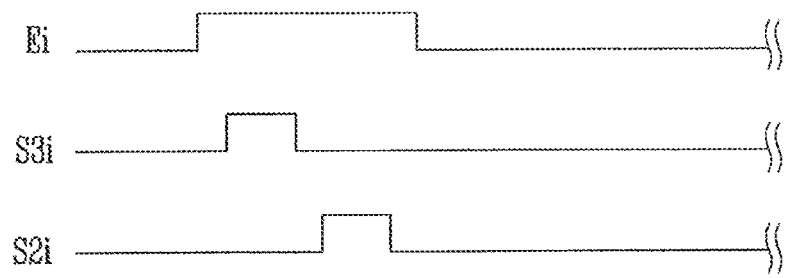
FIG. 6 illustrates an embodiment of a method of driving the pixel in FIG. 5.

FIG. 6 illustrates a waveform of an embodiment of a method for driving the pixel 140b in FIG. 5. Referring to FIG. 6, a light emission control signal may be supplied to the light emission control line Ei to turn off the sixth transistor M6(L) and the seventh transistor M7(L). When the sixth transistor M6(L) and the seventh transistor M7(L) are turned off, the pixel 140 may be set to a non-light emitting state.

Subsequently, a third scan signal may be supplied to the ith third scan line S3i. When the third scan signal is supplied to the ith third scan line S3i, the fourth transistor M4(O) may be turned on. When the fourth transistor M4(O) is turned on, the voltage of the initialization power supply Vint may be supplied to the second node N2.

A second scan signal may be supplied to the ith second scan line S2i after the voltage of the initialization power supply Vint is supplied to the second node N2. When the second scan signal is supplied to the ith second scan line S2i, the second transistor M2(O), the third transistor M3(O), and the fifth transistor M5(O) are turned on. When the fifth transistor M5(O) is turned on, the voltage of the initialization power supply Vint may be supplied to the anode electrode of the organic light emitting diode OLED.

When the second transistor M2(O) is turned on, the data line Dm may be electrically connected to the first node N1 to supply a data signal from the data line Dm to the first node N1.

When the third transistor M3(O) is turned on, the first transistor M1(L) may be placed in a diode-connected state. Since the second node N2 is initialized to the voltage of the initialization power supply Vint lower than the data signal, the first transistor M1(L) may be turned on. When the first transistor M1(L) is turned on, the data signal supplied to the first node NI may pass to the second node N2 through the first transistor M(L) in a diode-connected state. The second node N2 may be set to a voltage corresponding to the data signal and a threshold voltage of the first transistor M1(L). The storage capacitor Cst may store a voltage applied to the second node N2.

After the voltage of the second node N2 is stored in the storage capacitor Cst, supply of the light emission control signal to the light emission control line Ei may be stopped. The sixth transistor M6(L) and the seventh transistor M7(L) may be turned on when the supply of the light emission control signal to the light emission control line Ei is stopped.

When the sixth transistor M6(L) and the seventh transistor M7(L) are turned on, a current supply path may be formed from the first driving power supply ELVDD, through the organic light emitting diode OLED, and to the second driving power supply ELVSS. The first transistor M1(L) may control the amount of current flowing from the first driving power supply ELVDD through the organic light emitting diode OLED to the second driving power supply ELVSS based on the voltage of the second node N2.

According to the present embodiment, transistors M7(L), M1(L), and M6(L) in the current supply path for supplying current to the organic light emitting diode OLED may be LTPS thin film transistors. When transistors M7(L), M1(L), and M6(L) in the current supply path are LTPS thin film transistors, current may be stably supplied to the organic light emitting diode OLED by high driving characteristics.

In addition, according to the present embodiment, the transistors M2(O), M3(O), M4(O), and M5(O) which are not in the current supply path may be oxide semiconductor thin film transistors. When the transistors M2(O), M3(O), M4(O), and M5(O) which are not in the current supply path are oxide semiconductor thin film transistors, leakage current may be reduced and an image with desired brightness may be displayed.

Figure 7:
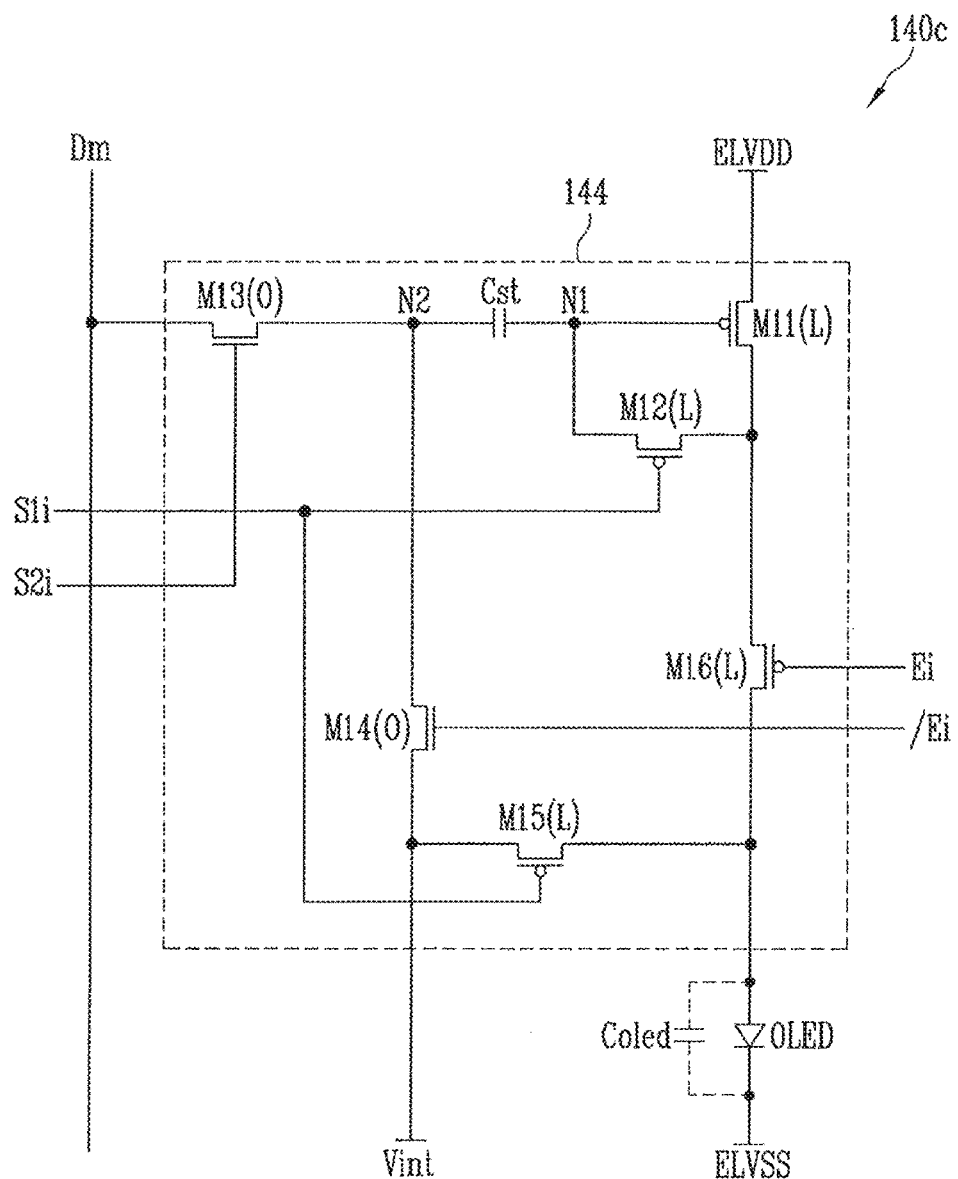
FIG. 7 illustrates another embodiment of a pixel.

FIG. 7 illustrates another embodiment of a pixel 140c, which, for example, may be presentative of the pixels in the display device of FIG. 1. For convenience of explanation, in FIG. 7, pixel 140c is illustrated as being located in the ith horizontal line and the mth data line Dm.

Referring to FIG. 7, the pixel 140c may include a pixel circuit 144 and organic light emitting diode OLED. The organic light emitting diode OLED has an anode electrode coupled to the pixel circuit 144 and a cathode electrode coupled to the second driving power supply ELVSS. The organic light emitting diode OLED may emit light with predetermined brightness based on the amount of current from the pixel circuit 144.

The pixel circuit 144 may control the amount of current flowing from the first driving power supply ELVDD, through the organic light emitting diode OLED, and to the second driving power supply ELVSS based on a data signal. The pixel circuit 144 may include a first transistor M11(L), a second transistor M12(L), a third transistor M13(O), a fourth transistor M14(O), a fifth transistor M15(L), a sixth transistor M16(L) and the storage capacitor Cst.

The first transistor M11(L) has a first electrode coupled to the first driving power supply ELVDD, a second electrode coupled to a first electrode of the sixth transistor M16(L), and a gate electrode coupled to the first node N1. The first transistor M11(L) may control the amount of current flowing from the first driving power supply ELVDD, through the organic light emitting diode OLED, and to the second driving power supply ELVSS based on a voltage of the first node N1. To ensure high driving speed, first transistor M11(L) may be, for example, a p-type LTPS thin film transistor.

The second transistor M12(L) may be coupled between the first node N1 and a second electrode of the first transistor M11(L). A gate electrode of the second transistor M12(L) may be coupled to the ith first scan line S1i. The second transistor M12(L) may be turned on when a first scan signal is supplied to the ith first scan line S1i. When the second transistor M12(L) is turned on, the first transistor M11(L) may be placed in a diode-connected state. The second transistor M12(L) may be, for example, a p-type LTPS thin film transistor.

The third transistor M13(O) may be coupled between the data line Dm and the second node N2. A gate electrode of the third transistor M13(O) may be coupled to the ith second scan line S2i. The third transistor M13(O) may be turned on when a second scan signal is supplied to the ith second scan line S2i. When the third transistor M13(O) is turned on, the data line Dm may be electrically connected to the second node N2.

When the third transistor M13(O) is an oxide semiconductor thin film transistor, the third transistor M13(O) may be, for example, an n-type transistor. When the third transistor M13(O) is an oxide semiconductor thin film transistor, leakage current between the second node N2 and the data line Dm may be reduced and an image with desired brightness may be displayed.

The fourth transistor M14(O) may be coupled between the second node N2 and the initialization power supply Vint. A gate electrode of the fourth transistor M14(O) may be coupled to an inverted light emission control line /Ei. The fourth transistor M14(O) may be turned off when an inverted light emission control signal is supplied to the inverted light emission control line /Ei, and may be turned on when the inverted light emission control signal is not supplied. When the fourth transistor M14(O) is turned on, a voltage of the initialization power supply Vint may be supplied to the second node N2.

When the fourth transistor M14(O) is an oxide semiconductor thin film transistor, the fourth transistor M14(O) may be, for example, an n-type transistor. When the fourth transistor M14(O) is an oxide semiconductor thin film transistor, leakage current between the second node N2 and the initialization power supply Vint may be reduced and an image with desired brightness may be displayed.

In one embodiment, the inverted light emission control signal supplied to the inverted light emission control line /Ei may be set to an inverted signal of the light emission control signal supplied to the light emission control line Ei. For example, when the light emission control signal is set to a predetermined high voltage, the inverted light emission control signal may be set to a predetermined low voltage.

The fifth transistor M15(L) may be coupled between the anode electrode of the organic light emitting diode OLED and the initialization power supply Vint. A gate electrode of the fifth transistor M15(L) may be coupled to the ith first scan line S1i. The fifth transistor M15(L) may be turned on when the first scan signal is supplied to the ith first scan line S1i. When the fifth transistor M15(L) is turned on, the voltage of the initialization power supply Vint may be supplied to the anode electrode of the organic light emitting diode OLED. The fifth transistor M15(L) may be, for example, a p-type LTPS thin film transistor.

The sixth transistor M16(L) may be coupled between a second electrode of the first transistor M11(L) and the anode electrode of the organic light emitting diode OLED. A gate electrode of the sixth transistor M16(L) may be coupled to the light emission control line Ei. The sixth transistor M16(L) may be turned off when the light emission control signal is supplied to the light emission control line Ei, and may be turned on when the light emission control signal is not supplied. The sixth transistor M16(L) may be, for example, a p-type LTPS thin film transistor.

The storage capacitor Cst may be coupled between the first node N1 and the second node N2. The storage capacitor Cst may store a voltage corresponding to the data signal and a threshold voltage of the first transistor M11(L).

According to the present embodiment, the third transistor M13(O) and the fourth transistor M14(O) coupled to the second node N2 may be oxide semiconductor thin film transistors. When the third transistor M13(O) and the fourth transistor M14(O) are oxide semiconductor thin film transistors, voltage variations of the second node N2 by leakage current may be reduced and an image with desired brightness may be displayed.

According to the present embodiment, transistors M11(L) and M16(L) in the current supply path for supplying current to the organic light emitting diode OLED may be LTPS thin film transistors. When transistors M11(L) and M16(L) in the current supply path are LTPS thin film transistors, current may be stably supplied to the organic light emitting diode OLED by high driving characteristics.

Figure 8:
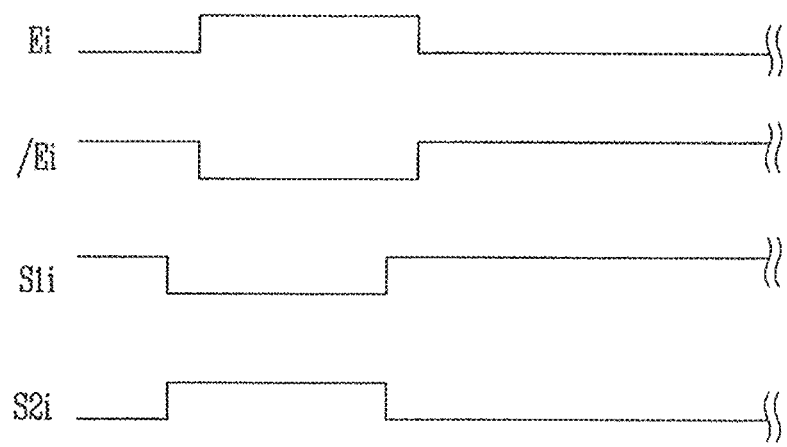
FIG. 8 illustrates a waveform for an embodiment of a method for driving a pixel.

FIG. 8 illustrates an embodiment of a waveform for the pixel in FIG. 7. In FIG. 8, a first scan signal may be supplied to the first scan line S1i and a second scan signal may be supplied to the second scan line S2i.

When the first scan signal is supplied to the first scan line S1i, the second transistor M12(L) and the fifth transistor M15(L) may be turned on. When the fifth transistor M15(L) is turned on, a voltage of the initialization power supply Vint may be supplied to the anode electrode of the organic light emitting diode OLED. When the voltage of the initialization power supply Vint is supplied to the anode electrode of the organic light emitting diode OLED, the organic capacitor Coled may be discharged.

When the second transistor M12(L) is turned on, the first transistor M11(L) may be placed in a diode-connected state. The first node N1 may be electrically connected to the initialization power supply Vint through the sixth transistor M16(L) and the fifth transistor M15(L). Therefore, the first node N1 may be initialized to the voltage of the initialization power supply Vint.

When a second scan signal is supplied to the second scan line S2i, the third transistor M13(O) may be turned on. The data line Dm may be electrically connected to the second node N2 when the third transistor M13(O) is turned on.

Subsequently, the light emission control signal may be supplied to the light emission control line Ei to at least partially overlap the first scan signal and the second scan signal, and an inverted light emission control signal may be supplied to the inverted light emission control line /Ei.

The sixth transistor M16(L) may be turned off when the light emission control signal is supplied to the light emission control line Ei. When the sixth transistor M16(L) is turned off, a voltage obtained by subtracting an absolute value of a threshold voltage of the first transistor M11(L) from the first driving power supply ELVDD may be applied to the first node N1 by the first transistor M11(L) in a diode-connected state.

When the inverted light emission control signal is supplied to the inverted light emission control line /Ei, the fourth transistor M14(O) may be turned off and electrical connection between the second node N2 and the initialization power supply Vint may be blocked. Since the third transistor M13(O) maintains a turn-on state, a voltage of a data signal may be applied to the second node N2.

The storage capacitor Cst may be charged with a voltage corresponding to a voltage difference between the second node N2 and the first node N1. Thus, the storage capacitor Cst may store a voltage corresponding to the data signal and the threshold voltage of the first transistor M11(L).

After the storage capacitor Cst is charged with a predetermined voltage, supply of the first scan signal to the first scan line S1i and supply of the second scan signal to the second scan line S2i may be stopped. When supply of the first scan signal is stopped, second transistor M12(L) and the fifth transistor M15(L) may be turned off. When supply of the second scan signal is stopped, third transistor M13(O) may be turned off.

Subsequently, supply of the light emission control signal to the light emission control line Ei may be stopped, and supply of the inverted light emission control signal to the inverted light emission control line /Ei may be stopped. When supply of the light emission control signal to the light emission control line Ei is stopped, the sixth transistor M16(L) may be turned on. When the sixth transistor M16(L) is turned on, first transistor M11(L) may be electrically connected to organic light emitting diode OLED.

When the supply of the inverted light emission control signal to the inverted light emission control line /Ei is stopped, the voltage of the initialization power supply Vint may be supplied to the second node N2. The voltage of the initialization power supply Vint may be set to a predetermined voltage in a voltage range of the data signal.

For example, the initialization power supply Vint may be set to a voltage higher than or equal to a black data signal or a voltage lower than a data signal having another grayscale level.

When the black data signal is applied to the second node N2, a voltage of the second node N2 may remain the same or be increased by a predetermined voltage when the voltage of the initialization power supply Vint is supplied. A voltage of the first node N1 may be increased by a predetermined voltage based on the change in the voltage of the second node N2 or remain the same as the previous period. For example, the first node N1 may be maintained at a voltage based on a difference between an absolute value of the threshold voltage of the first transistor M11(L) and the first driving power supply ELVDD. The first transistor M11(L) may maintain a turn-off state.

When a data signal corresponding to another grayscale level, except for black, is applied to the second node N2, the voltage of the second node N2 may be reduced by a predetermined voltage if the voltage of the initialization power supply Vint is supplied. The voltage of the first node N1 may be reduced by a predetermined voltage based on the change of the voltage of the second node N2. When the voltage of the first node N1 is reduced, the first transistor M11(L) may be turned on. The first transistor M11(L) may supply current corresponding to the first node N1 to organic light emitting diode OLED.

A falling width of the voltage of the second node N2 may be determined based on a data signal. For example, a falling width of the voltage of the first node N1 may be determined by the data signal, so that the first transistor M11(L) may control the amount of current based on the data signal.

Figure 9:
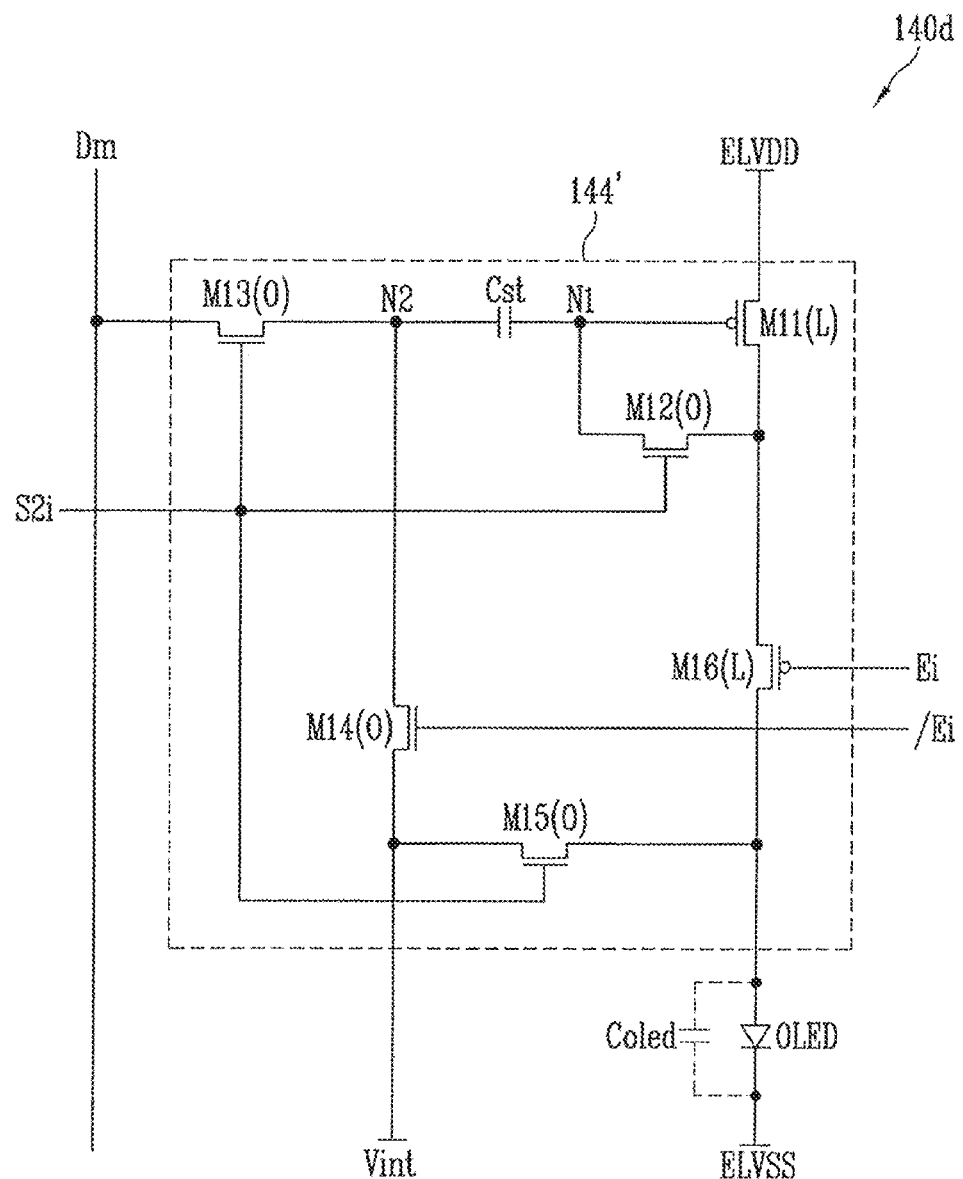
FIG. 9 illustrates another embodiment of a pixel.

FIG. 9 illustrates another embodiment of a pixel 140*d* which includes a pixel circuit 144' and the organic light emitting diode OLED. The organic light emitting diode OLED has an anode electrode coupled to the pixel circuit 144' and a cathode electrode coupled to the second driving power supply ELVSS. The organic light emitting diode OLED may emit light with predetermined brightness based on the amount of current supplied from the pixel circuit 144'.

The pixel circuit 144' may include the first transistor M11(L), a second transistor M12(O), the third transistor M13(O), the fourth transistor M14(O), a fifth transistor M15(O), the sixth transistor M16(L) and the storage capacitor Cst. The pixel circuit 144' may have substantially the same configuration as the pixel circuit 144 in FIG. 7, except that the second transistor M12(O) and the fifth transistor M15(O) are oxide thin film transistors.

The second transistor M12(O) may be coupled between the first node N1 and the second electrode of the first transistor M11(L). A gate electrode of the second transistor M12(O) may be connected to the ith second scan line S2i.

The second transistor M12(O) may be turned on when the second scan signal is supplied to the ith second scan line S2i. When the second transistor M12(O) is turned on, the first transistor M11(L) may be placed in a diode-connected state. The second transistor M12(O) may be, for example, an n-type oxide thin film transistor.

When the second transistor M12(O) is an oxide thin film transistor, leakage current flowing from the first node N1 to the second electrode of the first transistor M11(L) may be reduced and the organic light emitting diode OLED may emit light with desired brightness.

The fifth transistor M15(O) may be connected between the anode electrode of the organic light emitting diode OLED and the initialization power supply Vint. A gate electrode of the fifth transistor M15(O) may be coupled to the ith second scan line S2i. The fifth transistor M15(O) may be turned on when a second scan signal is supplied to the ith second scan line S2i. When the fifth transistor M15(O) is turned on, a voltage of the initialization power supply Vint may be supplied to the anode electrode of the organic light emitting diode OLED. The fifth transistor M15(O) may be, for example, an n-type oxide thin film transistor.

When the fifth transistor M15(O) is an oxide thin film transistor, leakage current flowing from the anode electrode of the organic light emitting diode OLED to the initialization power supply Vint may be reduced and the organic light emitting diode OLED may emit light with desired brightness. In addition, when the second transistor M12(O) and the fifth transistor M15(O) are n-type transistors, the first scan line S1 may be removed. The pixel 140*d* may be driven by a second scan line S2.

Figure 10:
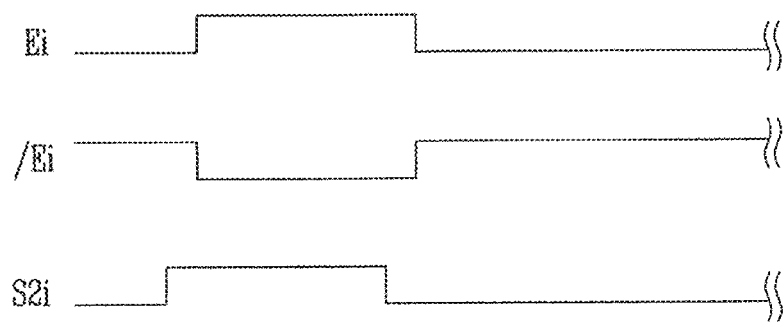
FIG. 10 illustrates a waveform for an embodiment of a method for driving a pixel.

FIG. 10 illustrates an embodiment of a method for driving the pixel in FIG. 9. The method includes, first, supplying a second scan signal to the second scan line S2i. When the second scan signal is supplied to the second scan line S2i, the second transistor M12(O), the third transistor M13(O) and the fifth transistor M15(O) may be turned on.

When the fifth transistor M15(O) is turned on, a voltage of the initialization power supply Vint may be supplied to the anode electrode of the organic light emitting diode OLED. When a voltage of the initialization power supply Vint is supplied to the anode electrode of the organic light emitting diode OLED, the organic capacitor Coled may be discharged.

When the second transistor M12(O) is turned on, the first transistor M11(L) may be placed in a diode-connected state. The first node N1 may be electrically connected to the initialization power supply Vint through the sixth transistor M16(L) and the fifth transistor M15(O). Therefore, the first node N1 may be initialized to the voltage of the initialization power supply Vint.

When the third transistor M13(O) is turned on, the data line Dm may be electrically connected to the second node N2.

Subsequently, to partially overlap a period of the second scan signal, a light emission control signal may be supplied to the light emission control line Ei and an inverted light emission control signal may be supplied to the inverted light emission control line /Ei. When the light emission control signal is supplied to the light emission control line Ei, the sixth transistor M16(L) may be turned off. When the sixth transistor M16(L) is turned off, a voltage, based on a difference between an absolute value of a threshold voltage of the first transistor M11(L) and first driving power supply ELVDD, is applied to the first node N1 by the first transistor M11(L) in a diode-connected state.

When the inverted light emission control signal is supplied to the inverted light emission control line /Ei, the fourth transistor M14(O) may be turned off. When the fourth transistor M14(O) is turned off, electrical connection between the second node N2 and initialization power supply Vint may be blocked. Since the third transistor M13(O) maintains a turn-on state, a voltage of a data signal may be applied to second node N2.

The storage capacitor Cst may store a voltage based on a difference between the second node N2 and the first node N1. For example, a voltage corresponding to the data signal and the threshold voltage of the first transistor M11(L) may be stored in the storage capacitor Cst.

After a predetermined voltage is stored in the storage capacitor Cst, supply of the second scan signal to the second scan line S2i may be stopped. When the supply of the second scan signal to the second scan line S2i is stopped, the second transistor M12(O), the third transistor M13(O) and the fifth transistor M15(O) may be turned off.

Subsequently, supply of the light emission control signal to the light emission control line Ei may be stopped and supply of the inverted light emission control signal to the inverted light emission control line /Ei may be stopped. The sixth transistor M16(L) may be turned on when supply of the light emission control signal to the light emission control line Ei is stopped. When the sixth transistor M16(L) is turned on, the first transistor M11(L) may be electrically connected to the organic light emitting diode OLED. When supply of the inverted light emission control signal to the inverted light emission control line /Ei is stopped, the voltage of the initialization power supply Vint may be supplied to the second node N2.

A voltage of the first node N1 may be changed based on the change in voltage of the second node N2. The first transistor M11(L) may control the amount of current flowing from the first driving power supply ELVDD, through the organic light emitting diode OLED, and to the second driving power supply ELVSS based on the voltage of the first node N1. In one embodiment, the scan driver 110 may include a plurality of stage circuits for generating at least one of a first scan signal, a second scan signal or a light emission control signal.

Figure 11:
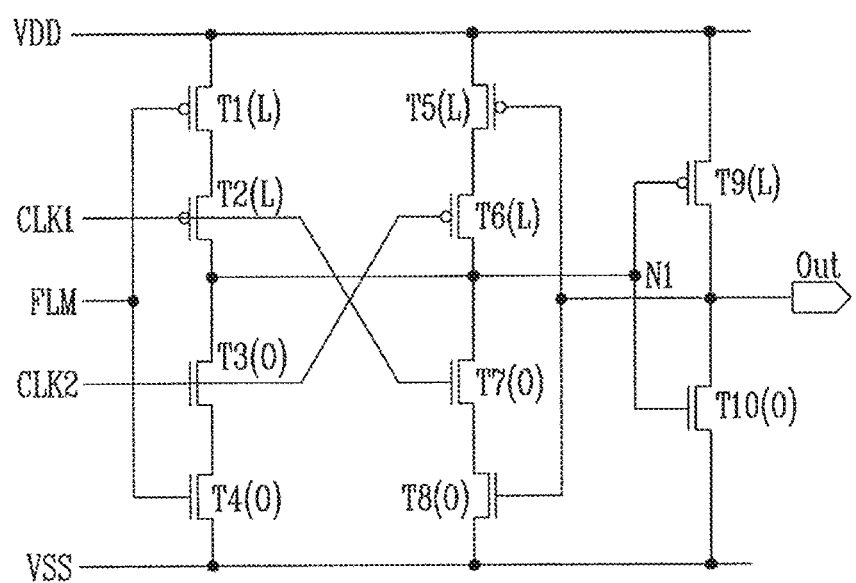
FIG. 11 illustrates an embodiment of a stage circuit.

FIG. 11 illustrates an embodiment of a stage circuit which includes an oxide semiconductor thin film transistor and a Low Temperature Poly-Silicon(LTPS) thin film transistor. The stage circuit may include a first transistor T1(L), a second transistor T2(L), a fifth transistor T5(L), a sixth transistor T6(L) and a ninth transistor T9(L) which are composed of LTPS thin film transistors. In addition, the stage circuit may include a third transistor T3(O), a fourth transistor T4(O), a seventh transistor T7(O), an eighth transistor T8(O) and a tenth transistor T10(O) which are composed of oxide semiconductor thin film transistors.

The first transistor T1(L), the second transistor T2(L), the third transistor T3(O), and the fourth transistor T4(O) may be coupled in series between a first power supply VDD and a second power supply VSS. The first power supply VDD may be set to a high voltage and the second power supply VSS may be set to a low voltage.

A gate electrode of the first transistor T1(L) may receive a start pulse FLM or an output signal from the previous stage. The first transistor T1(L) may be, for example, a p-type transistor which turns on when the start pulse FLM or the output signal(high voltage) from the previous stage is not supplied.

A gate electrode of the second transistor T2(L) may receive a first clock signal CLK1. The second transistor T2(L) may be, for example, a p-type transistor which is turned on when the first clock signal CLK1 is set to a low voltage.

A gate electrode of the third transistor T3(O) may receive a second clock signal CLK2. The third transistor T3(O) may be, for example, an n-type transistor and turned on when the second clock signal CLK2 is set to a high voltage. The first clock signal CLK1 and the second clock signal CLK2 may have the same cycle and be set to phase inverted signals.

A gate electrode of the fourth transistor T4(O) may receive the start pulse FLM or an output signal from the previous stage. The fourth transistor T4(O) may be, for example, an n-type transistor and turned on when the start pulse FLM or the output signal from the previous stage is supplied. In addition, a common node between the second transistor T2(L) and the third transistor T3(O) may be electrically connected to the first node N1.

The fifth transistor T5(L), the sixth transistor T6(L), the seventh transistor T7(O), and the eighth transistor T8(O) may be coupled in series between the first power supply VDD and the second power supply VSS.

A gate electrode of the fifth transistor T5(L) may be electrically connected to an output terminal. The fifth transistor T5(L) may be, for example, a p-type transistor and turned on or off based on a voltage from the output terminal.

A gate electrode of the sixth transistor T6(L) may receive the second clock signal CLK2. The sixth transistor T6(L) may be, for example, a p-type transistor and turned on when the second clock signal CLK2 is set to a low voltage.

A gate electrode of the seventh transistor T7(O) may receive the first clock signal CLK1. The seventh transistor T7(O) may be, for example, an n-type transistor and turned on when the first clock signal CLK1 is set to a high voltage.

A gate electrode of the eighth transistor T8(O) may be electrically connected to the output terminal. The eighth transistor T8(O) may be, for example, an n-type transistor and turn on or off based on a voltage of the output terminal. In addition, a common node between the sixth transistor T6(L) and the seventh transistor T7(O) may be electrically connected to the first node N1.

The ninth transistor T9(L) and the tenth transistor T10(O) may be coupled in series between the first power supply VDD and the second power supply VSS.

A gate electrode of the ninth transistor T9(L) may be coupled to the first node N1. The ninth transistor T9(L) may be, for example, a p-type transistor and turned on or off based on a voltage of the first node N1.

A gate electrode of the tenth transistor T10(O) may be connected to the first node N1. The tenth transistor T10(O) may be, for example, an n-type transistor and turned on or off based on the voltage of the first node N1. In addition, a common node between the ninth transistor T9(L) and the tenth transistor T10(O) may be electrically connected to the output terminal.

Thus, in one embodiment, the stage circuit includes one or more p-type transistors and one or more n-type transistors. In one embodiment, the stage circuit may include one or more LTPS thin film transistors as p-type transistors and one or more oxide semiconductor thin film transistors as n-type transistors. When the stage circuit is formed using LTPS thin film and oxide semiconductor thin film transistors, leakage current may be reduced and a high driving speed may be ensured.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods(or operations of the computer, processor, controller, or other signal processing device) are described in detail, the code or instructions for implementing the operations of the method embodiments may transform the computer, processor, controller, or other signal processing device into a special-purpose processor for performing the methods herein.

The drivers, controllers, and other processing features described herein may be implemented in logic which, for example, may include hardware, software, or both. When implemented at least partially in hardware, the drivers, controllers, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the drivers, controllers, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a pixel may include at least one oxide semiconductor thin film transistor and at least one LTPS thin film transistor. The oxide semiconductor thin film transistor having excellent off characteristics may be in a current leakage path, in order to reduce current leakage and display an image with desired brightness.

In addition, an LTPS thin film transistor having excellent driving characteristics may be in a current supply path for supplying current to an organic light emitting diode, so that current may be stably supplied to the organic light emitting diode by high driving characteristics of the LTPS thin film transistor. In addition, a stage circuit may include an oxide semiconductor thin film transistor and an LTPS thin film transistor, so that the stage circuit may have reduced current leakage and have a high driving speed.

Example embodiments have been disclosed herein, and although specific terms are employed, they are used and are to be interpreted in a generic and descriptive sense only and not for purpose of limitation. The embodiments(or portions thereof) may be combined to form additional embodiments. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A pixel, comprising:
an organic light emitting diode;
a first transistor controlling an amount of driving current flowing from a first driving power supply to a second driving power supply through the organic light emitting diode;
a second transistor coupled between a data line and a first electrode of the first transistor, and a gate electrode of the second transistor coupled to a first scan line;
a third transistor coupled between a gate electrode and a second electrode of the first transistor, and a gate electrode of the third transistor coupled to a second scan line, wherein
each of the second transistor and the third transistor includes an active layer including an oxide semiconductor material, and
a first scan signal of a turn-on level supplied to the first scan line and a second scan signal of a turn-on level supplied to the second scan line are set to signals having same polarities and overlapping.

2. The pixel of claim 1,
wherein the first transistor includes an active layer including polysilicon.

3. The pixel of claim 1, further comprising:
a fourth transistor coupled between the gate electrode of the first transistor and an initialization power supply, and a gate electrode of the fourth transistor coupled to a third scan line,
wherein the fourth transistor includes an active layer including an oxide semiconductor material and a third scan signal is supplied to the third scan line.

4. The pixel of claim 3,
wherein the first scan signal of the turn-on level and the third scan signal of a turn-on level are not overlapped.

5. The pixel of claim 3, further comprising:
a fifth transistor coupled between the initialization power supply and an anode electrode of the organic light emitting diode, and a gate electrode of the fifth transistor coupled to a fourth scan line,
wherein the fifth transistor includes an active layer including an oxide semiconductor material and a fourth scan signal is supplied to the fourth scan line.

6. The pixel of claim 5,
wherein the first scan signal of the turn-on level and the fourth scan signal of a turn-on level are set to signals having same polarities and overlapping.

7. The pixel of claim 5, further comprising:
a sixth transistor coupled between the second electrode of the first transistor and the anode electrode of the organic light emitting diode, and a gate electrode of the sixth transistor coupled to a first light emission control line,
wherein the sixth transistor includes an active layer including polysilicon.

8. The pixel of claim 7,
wherein the first scan signal of the turn-on level and the third scan signal of the turn-on level are overlapped with a first light emission control signal of a turn-off level supplied to the first light emission control line.

9. The pixel of claim 7, further comprising:
a seventh transistor coupled between the first electrode of the first transistor and the first driving power supply, and a gate electrode of the seventh transistor coupled to a second light emission control line,
wherein the seventh transistor includes an active layer including polysilicon.

10. The pixel of claim 9,
wherein a first light emission control signal of the turn-off level supplied to the first light emission control line and a second light emission control signal of a turn-off level supplied to the second light emission control line are set to signals having same polarities and overlapping.

11. The pixel of claim 9, further comprising:
a capacitor coupled between the first driving power supply and the gate electrode of the first transistor.

12. A pixel, comprising:
an organic light emitting diode;
a first transistor controlling an amount of driving current flowing from a first driving power supply to a second driving power supply through the organic light emitting diode;
a second transistor coupled between a data line and a gate electrode of the first transistor, a gate electrode of the second transistor coupled to a first scan line;
a capacitor coupled to the gate electrode of the first transistor;
a third transistor coupled between the first transistor and an anode electrode of the organic light emitting diode, a gate electrode of the third transistor coupled to a first light emission control line; and
a fourth transistor coupled between the third transistor and an initialization power supply, and a gate electrode of the fourth transistor coupled to a second scan line,
wherein each of the second transistor and the fourth transistor includes an active layer including an oxide semiconductor material, and
wherein the third transistor includes an active layer including polysilicon.

13. The pixel of claim 12,
wherein a first scan signal of a turn-on level supplied to the first scan line and a second scan signal of a turn-on level supplied to the second scan line are set to signals having same polarities and overlapping.

14. The pixel of claim 13,
wherein a first light emission control signal of a turn-off level supplied to the first light emission control line is partially overlapped with the first scan signal of the turn-on level.

15. The pixel of claim 12, further comprising:
a fifth transistor coupled between the gate electrode and a first electrode of the first transistor, a gate electrode of the fifth transistor coupled to a third scan line,
wherein the fifth transistor includes an active layer including an oxide semiconductor material and a third scan signal is supplied to the third scan line.

16. The pixel of claim 15,
wherein a first scan signal of a turn-on level supplied to the first scan line and the third scan signal of a turn-on level are set to signals having same polarities and overlapping.

17. The pixel of claim 15, further comprising:
a sixth transistor coupled between the capacitor and the initialization power supply, a gate electrode of the sixth transistor coupled to a second light emission control line,
wherein the sixth transistor includes an active layer including an oxide semiconductor material and a second light emission control signal is supplied to the second light emission control line.

18. The pixel of claim 17,
wherein a first light emission control signal of a turn-off level supplied to the first light emission control line and the second light emission control signal of a turn-off level are set to signals having opposite polarities and overlapping.

* * * * *